ns(12) United States Patent
Suzuki et al.

(10) Patent No.: US 7,932,797 B2
(45) Date of Patent: Apr. 26, 2011

(54) ELECTROMAGNETIC DRIVE SYSTEM

(75) Inventors: Tsuneo Suzuki, Mönchweiler (DE);
Rolf Dupper, Villingen-Schwenningen (DE)

(73) Assignee: Harman Becker Automotive Systems GmbH, Karlsbad (DE)

(*) Notice: Subject to any disclaimer, the term of this patent is extended or adjusted under 35 U.S.C. 154(b) by 725 days.

(21) Appl. No.: 11/873,688

(22) Filed: Oct. 17, 2007

(65) Prior Publication Data

US 2008/0089191 A1 Apr. 17, 2008

(30) Foreign Application Priority Data

Oct. 17, 2006 (EP) .................................. 06021727

(51) Int. Cl.
*H01F 7/08* (2006.01)
*H01F 7/00* (2006.01)
*H01F 5/00* (2006.01)
*H01F 1/00* (2006.01)
*G11B 7/00* (2006.01)
*G02B 7/02* (2006.01)

(52) U.S. Cl. ........ 335/222; 335/219; 335/220; 335/229; 335/282; 335/296; 335/299; 335/302; 369/44.14; 369/44.15; 369/44.22; 359/814; 359/824; 720/683

(58) Field of Classification Search .................. 335/219, 335/220, 222, 229, 282, 296, 299, 302; 369/44.11, 369/44.14, 44.15, 44.16, 44.22, 135, 243, 369/244.1, 247, 247.1; 359/813, 814, 822, 359/823, 824; 720/681, 682, 683, 684, 685, 720/662
See application file for complete search history.

(56) References Cited

U.S. PATENT DOCUMENTS

| 4,187,485 | A * | 2/1980 | Wollnik | 335/299 |
| 5,191,484 | A * | 3/1993 | Yeon et al. | 359/824 |
| 5,555,228 | A * | 9/1996 | Izuka | 369/44.15 |
| 6,504,813 | B2 * | 1/2003 | Suzuki et al. | 720/683 |
| 6,741,543 | B1 * | 5/2004 | Suzuki et al. | 720/683 |
| 2001/0028515 | A1 * | 10/2001 | Kawano | 359/822 |
| 2002/0005995 | A1 * | 1/2002 | Choi et al. | 359/819 |
| 2003/0043725 | A1 | 3/2003 | Hanks | |
| 2003/0198148 | A1 * | 10/2003 | Choi | 369/44.16 |
| 2004/0027674 | A1 * | 2/2004 | Kato et al. | 359/618 |
| 2004/0252596 | A1 * | 12/2004 | Cho et al. | 369/44.12 |
| 2005/0060732 | A1 | 3/2005 | Kang et al. | |
| 2005/0180274 | A1 * | 8/2005 | Im et al. | 369/44.15 |
| 2007/0104044 | A1 * | 5/2007 | Kim et al. | 369/44.15 |
| 2009/0103209 | A1 * | 4/2009 | Bammert et al. | 360/123.01 |

FOREIGN PATENT DOCUMENTS

EP 1339051 A2 8/2003

* cited by examiner

*Primary Examiner* — Elvin G Enad
*Assistant Examiner* — Mohamad A Musleh
(74) *Attorney, Agent, or Firm* — Brinks Hofer Gilson & Lione

(57) ABSTRACT

An electromagnetic drive includes a drive plate disposed in a magnetic field. The drive plate includes a non-conductive medium with a first plurality of linear conductive elements arranged parallel to a first axis. The first plurality of linear conductive elements connects first and second electrical terminals supported by the non-conductive medium. The drive plate may be driven in the magnetic field along a second axis that is substantially perpendicular to the first axis when an electrical current of sufficient magnitude is passed through the first plurality of linear conductive elements.

10 Claims, 5 Drawing Sheets

ELECTROMAGNETIC DRIVE SYSTEM

PRIORITY CLAIM

This application claims the benefit of priority to European Patent Application No. 06021727.0, filed Oct. 17, 2006, which is incorporated by reference.

BACKGROUND OF THE INVENTION

1. Technical Field

The present invention relates to an electromagnetic drive system that is suitable for moving an object, such as an optical and/or electrical reader/writer, along at least one motion axis.

2. Related Art

Electromagnetic drive systems are used in a wide variety of applications. One such application involves the use of an electromagnetic drive to properly orient a reading and/or writing component of a storage device, such as the objective lens of an optical reader, with respect to the storage media. The electromagnetic drive system used in such storage devices may direct the reading and/or writing component radially with respect to the storage media in a tracking direction, perpendicularly with respect to the storage media in a focusing direction, and/or rotationally to compensate for tilting errors between the reading and/or writing component and the storage media.

The electromagnetic drive system used in such storage devices may include multiple magnets that are fixed on a base. The magnets may be multiple pole magnets, such as 8-pole magnets, that are arranged so that a pole of a first magnet faces the opposite pole of a second magnet. Printed circuit boards may be disposed between the magnets and mounted so that they are movable with respect to the base along a tracking axis, a focusing axis, and/or a tilting axis. Magnetic circuits on the surface of the printed circuit boards are actuated while in the magnetic field of the multiple pole magnets to generate motion along the various axes. The magnetic circuits may be wound coils disposed on the surface(s) of the printed circuit boards and/or may be in the form of wound conductive lines formed on the surface(s) of the printed circuit boards.

The formation of the magnetic circuits on the surface(s) of the printed circuit boards may be complicated. Multiple layers of complex wound conductive lines may be required in some instances. Further, the magnetically active domains of the multiple layers of wound conductive lines may be small in comparison to the overall area used to form the magnetic circuit. This may result in a less than optimal use of space.

SUMMARY

An electromagnetic drive includes a drive plate disposed in a magnetic field. The drive plate includes a non-conductive medium with a first plurality of linear conductive elements arranged parallel to a first axis. The first plurality of linear conductive elements connects first and second electrical terminals supported by the non-conductive medium. The drive plate may be driven in the magnetic field along a second axis that is substantially perpendicular to the first axis when an electrical current of sufficient magnitude is passed through the first plurality of linear conductive elements.

Other systems, methods, features, and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
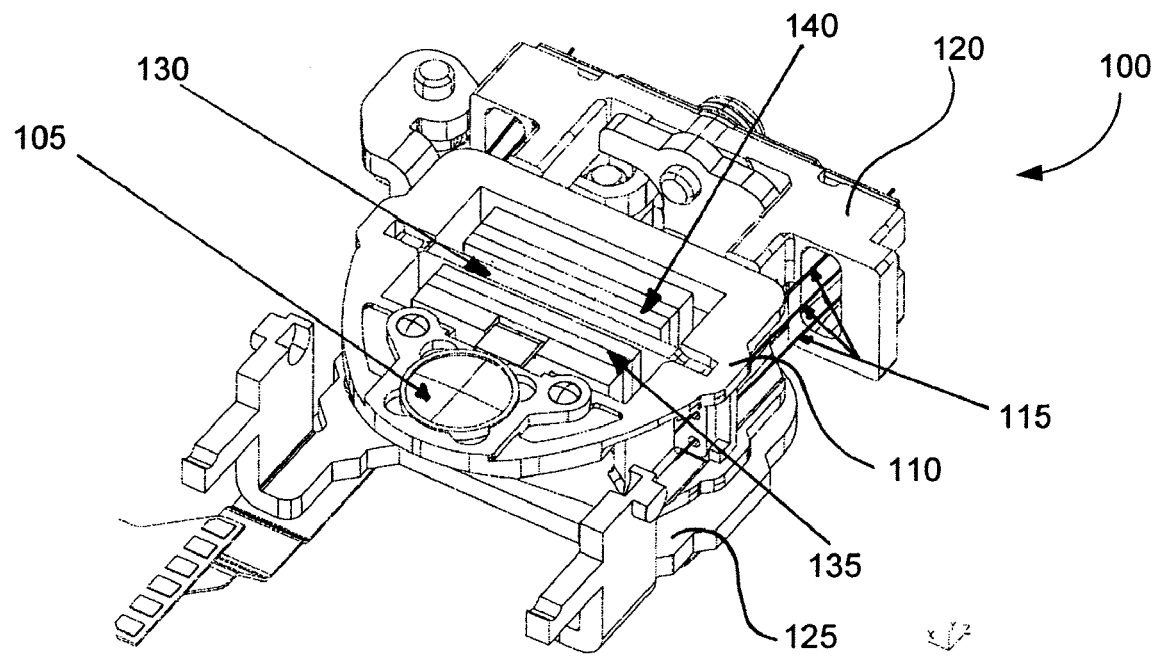
FIG. 1 is a perspective view of a system that employs an electromagnetic drive.

FIG. 1 shows a system 100 that employs an electromagnetic drive system. Although the electromagnetic drive system may be used in a wide range of applications, system 100 shows electromagnetic drive system in the context of adjusting the position of a reading and/or writing element used in a storage device. In FIG. 1, system 100 is in the form of an optical pickup actuator. The optical pickup actuator 100 includes an objective lens 105 that is mounted on a lens holder 110. A horizontal support member 115 includes a first end that engages a side of the lens holder 110. A second end of the horizontal support member 115 engages a vertical support member 120 that is in fixed alignment with a base 125. The lens holder 110 is movable with respect to the base 125 along one or more motion axes and/or about one or more motion axes.

A drive plate 130 is in fixed alignment with the lens holder 110 so that movement of the drive plate 130 results in a corresponding movement of the lens holder 110. The drive plate 130 is disposed in a magnetic field that is present between a pair of magnets 135 and 140. The magnets 135 and 140 may be arranged so that opposite poles of the magnets face one another in the area about the drive plate 130. Although the magnets 135 and 140 are shown as permanent magnets, electromagnets may also be used.

The drive plate 130 includes one or more electromagnetic circuits. The electromagnetic circuits are actuated by directing a flow of electrical current through them. Electrical current flowing through an electromagnetic circuit generates an electromotive force when in the magnetic field between magnets 135 and 140. The resulting electromotive force moves the drive plate 130 and the lens holder 110 in a manner dictated by the configuration of the electromagnetic circuit.

Figure 2:
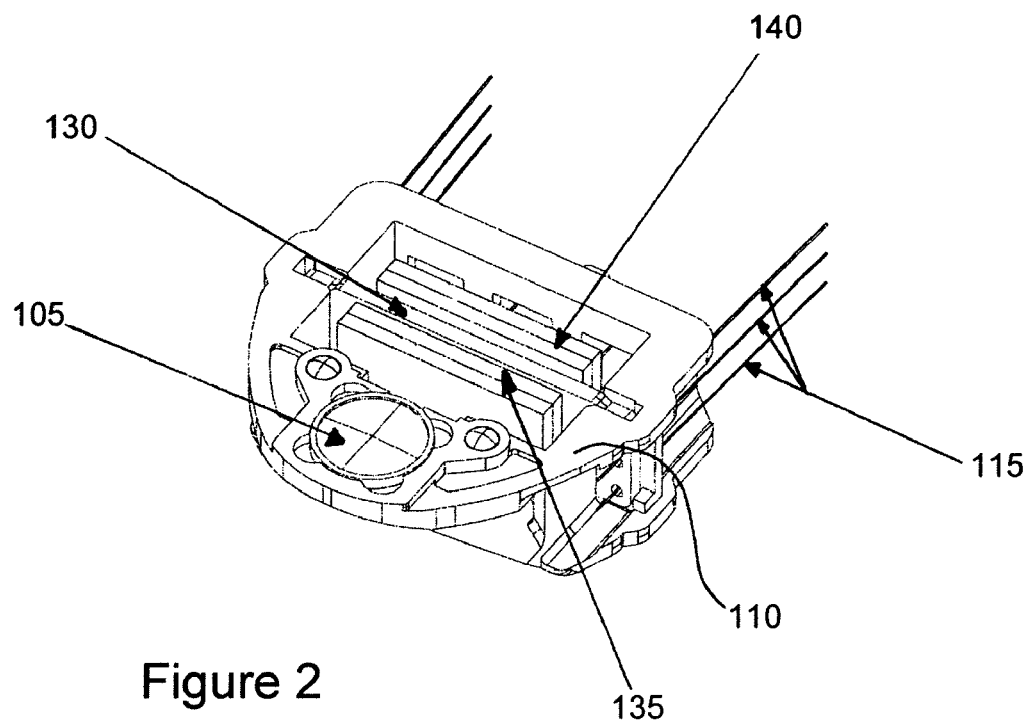
FIG. 2 is another perspective view of the optical pickup actuator shown in FIG. 1.

FIG. 2 is another perspective view of the optical pickup actuator 100. In this view, the vertical support mechanism 120 and base 125 have been removed.

Figure 3:
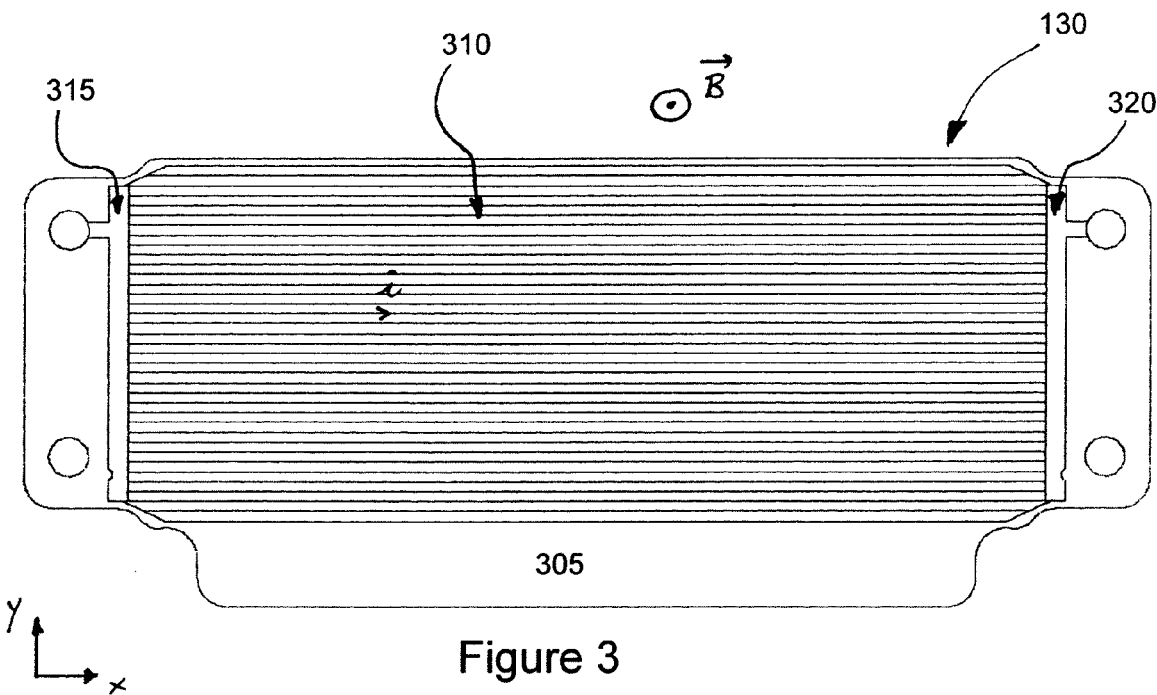
FIG. 3 is a plan view of a layer of a drive plate used in the electromagnetic drive of FIGS. 1 and 2.

FIG. 3 is a plan view of one side of the drive plate 130. Drive plate 130 may include a non-conductive medium 305 forming a body that supports the electromagnetic circuits of the drive plate 130. The non-conductive medium 305 may be formed from an epoxy, resin, or other non-conductive material.

In FIG. 3, the non-conductive medium 305 supports a plurality of linear conductive elements 310. The plurality of linear conductive elements 310 are arranged on the non-conductive medium 305 so that they are generally parallel to a first axis. Here, the first axis is disposed along the x-direction. A first conductive terminal 315 is disposed proximate a first end of the plurality of linear conductive elements 310. A second conductive terminal 320 is disposed proximate a second end of the plurality of linear conductive elements 310. Terminals 315 and 320 may be in the form of conductive strips that interconnect each end of the plurality of linear conductive elements 310.

The plurality of linear conductive elements 310 may be used to move the drive plate 130 along a second axis that is generally perpendicular to the first axis. The second axis may be disposed along the y-direction. When a current i passes between terminals 315 and 320 through the plurality of linear conductive elements 310, an electromagnetic field is generated. When the current is of a sufficient magnitude, this electromagnetic field interacts with the magnetic field B of the magnets 135 and 140 to move the drive plate 130 along the second axis. A current in the opposite direction to the one shown at i of FIG. 3 will result in motion of the drive plate 130 in an opposite direction along the second axis.

In FIGS. 1 and 2, movement of the lens holder 110 and objective lens 105 resulting from motion of the drive plate 130 in the y-direction may adjust the distance between the objective lens 105 and the storage medium. This adjustment may focus the objective lens 105 on the storage medium.

Figure 4:
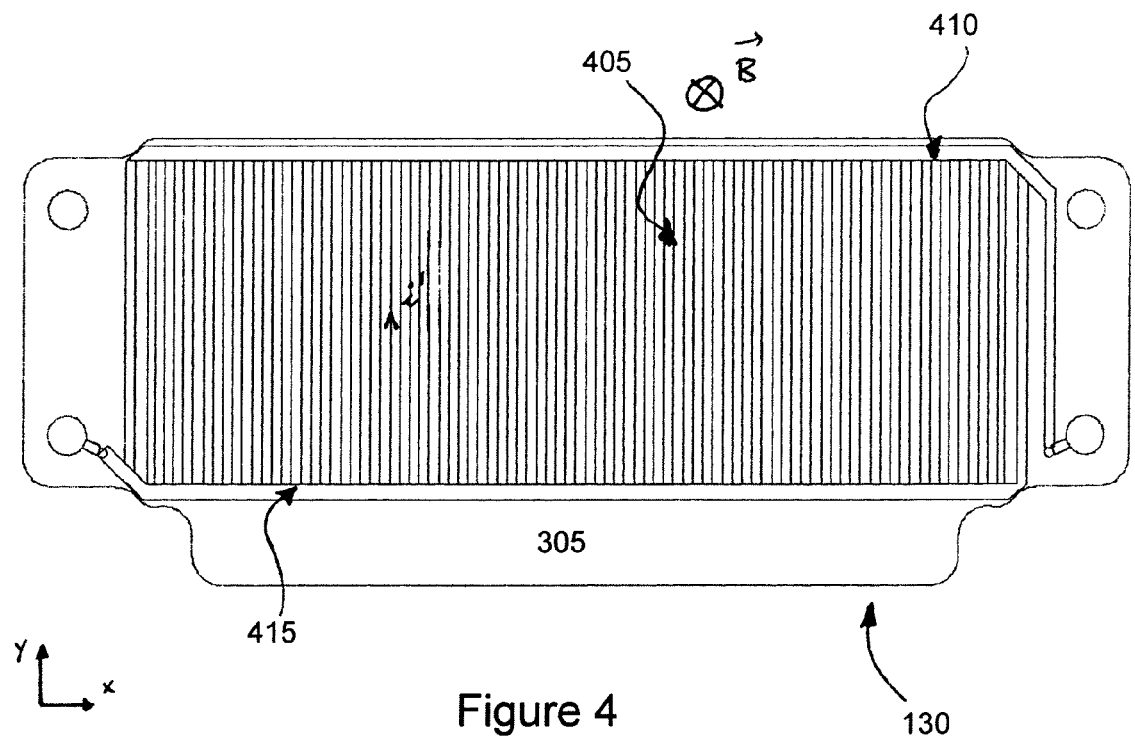
FIG. 4 is a plan view of a layer of the drive plate opposite the one shown in FIG. 3.

FIG. 4 is a plan view of a layer of the drive plate 130 opposite the layer of the drive plate 130 shown in FIG. 3. In FIG. 4, the non-conductive medium 305 supports a second plurality of linear conductive elements 405. The second plurality of linear conductive elements 405 are arranged on the non-conductive medium 305 so that they are generally parallel to a third axis. The third axis may be disposed along the y-direction. A third conductive terminal 410 is disposed proximate a first end of the second plurality of linear conductive elements 405. A fourth conductive terminal 415 is disposed proximate a second end of the second plurality of linear conductive elements 405. Terminals 410 and 415 may form conductive strips that interconnect each end of the second plurality of linear conductive elements 405.

The second plurality of linear conductive elements 405 may be used to move the drive plate 130 along a fourth axis that is generally perpendicular to the third axis. The fourth axis may be disposed along the x-direction. When a current i passes between terminals 415 and 410 through the second plurality of linear conductive elements 405, an electromagnetic field is generated. When the current is of a sufficient magnitude, this electromagnetic field interacts with the magnetic field B of the magnets 135 and 140 to move the drive plate 130 along the fourth axis. A current in the opposite direction to the one shown at i of FIG. 4 will result in motion of the drive plate 130 in an opposite direction along the fourth axis.

In the system 100 shown in FIGS. 1 and 2, movement of the lens holder 110 and objective lens 105 resulting from motion of the drive plate 130 in the x-direction may be used to adjust the objective lens 105 radially with respect to the storage medium. This adjustment may be used to adjust the tracking of the objective lens 105 with respect to the storage medium.

Figure 5:
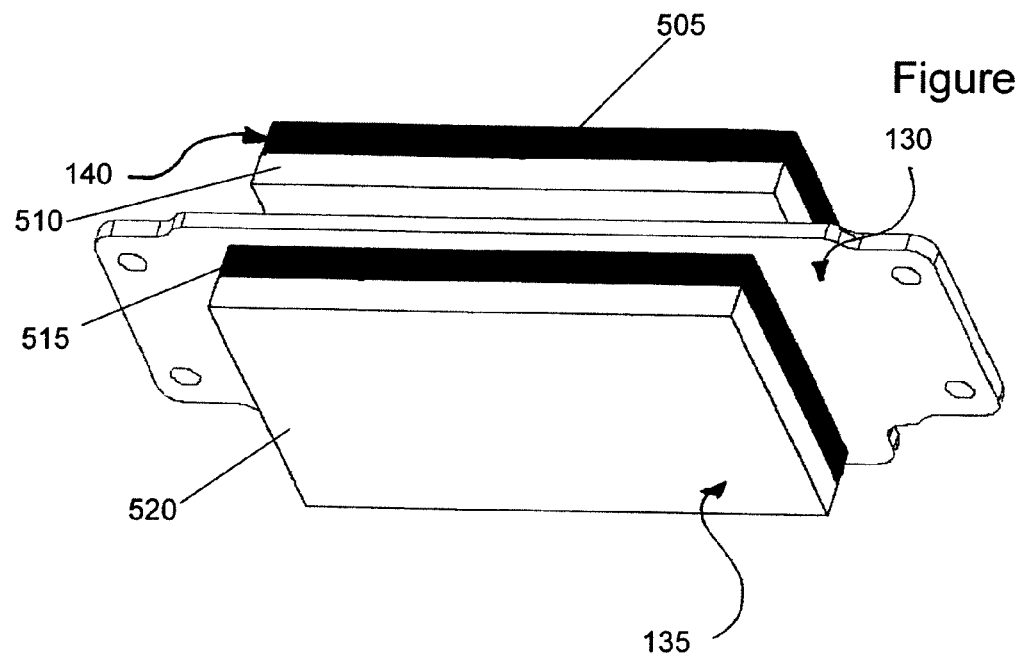
FIG. 5 is a perspective view of a configuration for arranging the magnets and drive plate of an electromagnetic drive.

In FIGS. 3 and 4, the magnetic field B has been applied perpendicular to a plane of the first linear conductive elements 310 and to a plane of the second linear conductive elements 405. This magnetic field arrangement may be obtained using the configuration shown in FIG. 5. In this configuration, the drive plate 130 is spaced between a first magnet 135 and a second magnet 140. Each of the magnets 135 and 140 may be two-pole magnet. Magnet 135 includes a north pole portion 515 and south pole portion 520. Magnet 140 includes a north pole portion 505 and south pole portion 510. Magnets 135 and 140 are arranged so that opposite poles are spaced from one another in the region proximate drive plate 130. In FIG. 5, the north pole portion 515 of magnet 135 is arranged to face the south pole portion 510 of magnet 140.

Linear conductive elements 310 and 405 may be electrically separated from one another by the non-conductive medium 305. To facilitate this isolation, the linear conductive elements 310 and 405 may be disposed on opposite planar surfaces of the non-conductive medium 305. Additionally, or in the alternative, one or both sets of linear conductive elements 310 and 405 may be embedded in the non-conductive medium 305.

Figure 6:
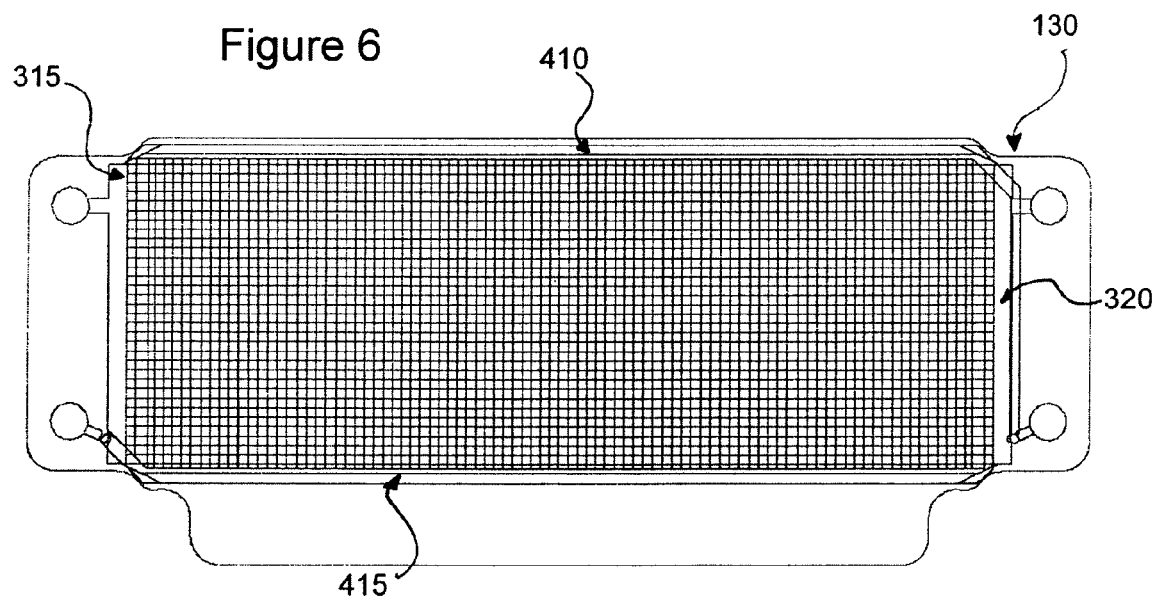
FIG. 6 is a plan view of an arrangement for the first and second plurality of linear conductive elements.
Figure 7:
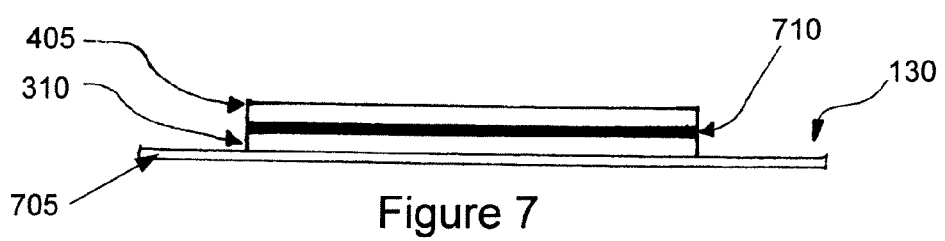
FIG. 7 is a side view of an arrangement for the first and second plurality of linear conductive elements.

FIGS. 6 and 7 illustrate a layered arrangement of the linear conductive elements 310 and 405 of the drive plate 130. In this arrangement, the first plurality of linear conductive elements 310 is formed exterior to a surface of a first non-conductive medium 705. A second non-conductive medium 710 is disposed over the first plurality of linear conductive elements 310. The second plurality of linear conductive elements 405 are disposed exterior to a surface of the second non-conductive medium 710. Although the second plurality of linear conductive elements 405 are formed exterior to the first plurality of linear conductive elements 310 in FIG. 7, their layering order may be reversed, with the first plurality of linear conductive elements 310 exterior to the second plurality of linear conductive elements 405.

Figure 8:
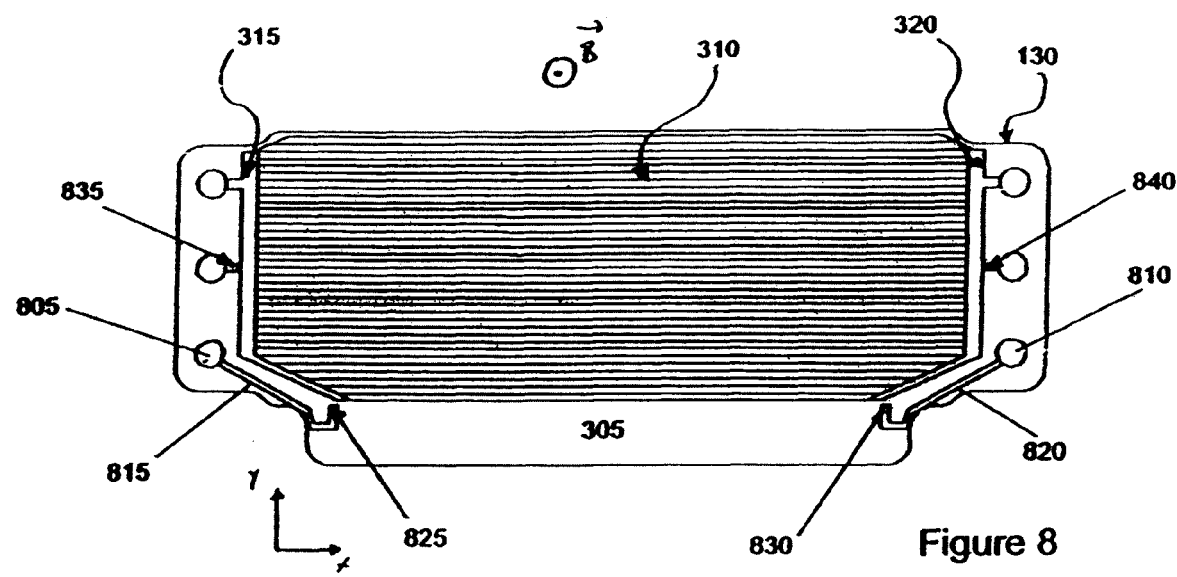
FIG. 8 is a plan view of an alternative layer arrangement for a drive plate.
Figure 9:
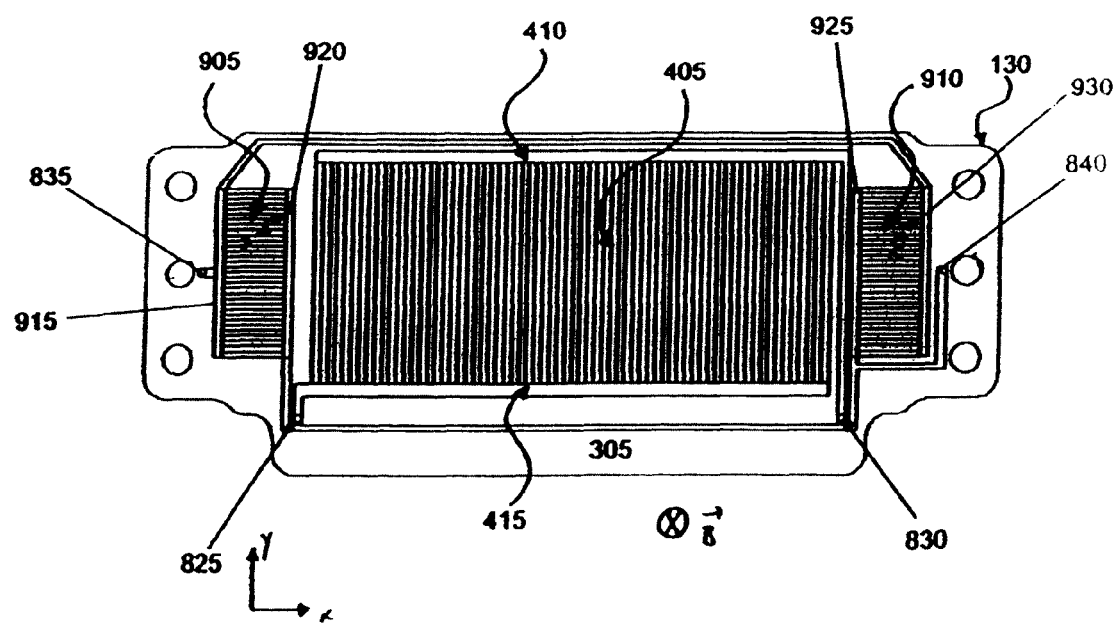
FIG. 9 is a plan view of a layer of the drive plate shown in FIG. 8 having a third and fourth plurality of linear conductive elements for use in rotating the drive plate about an axis.

FIG. 8 shows a layer of a drive plate 130 supporting the first plurality of linear conductive elements 310. In FIG. 8, the first plurality of linear conductive elements 310 is supported by the non-conductive medium 305 so that the elements extend linearly along the x-direction. The first terminal 315 and the second terminal 320 are connected through the first plurality of linear conductive elements 310. A further set of conductive lines 805 and 810 extend between connection terminals 815 and 820, respectively, to respective through-connects 825 and 830 to one or more further layers of the drive plate 130. With reference to FIG. 9, the through-connects 825 and 830 may provide electrical power to a layer of the drive plate 130 supporting the second plurality of linear conductive elements 405. A further set of conductive lines, connection terminals, and through-connects 835 and 840 may be used to provide power to one or more further layers of the drive plate 130. In FIG. 9, through-connects 835 and 840 may provide power to a third and fourth plurality of linear conductive elements.

FIG. 9 shows a layer of the drive plate 130 supporting the second plurality of linear conductive elements 405. In FIG. 9, the second plurality of linear conductive elements 405 are supported by the non-conductive medium 305 so that the elements extend linearly along the y-direction. The third conductive terminal 410 and fourth conductive terminal 415 may form conductive strips disposed at opposite sides of the second plurality of linear conductive elements 405.

In FIG. 9, the drive plate 130 includes a third plurality of linear conductive elements 905 as well as a fourth plurality of linear conductive elements 910. The third and fourth plurality of linear conductive elements 905 and 910 may be arranged on the non-conductive medium in the same or substantially the same plane as the second plurality of linear conductive elements 405. The third and fourth plurality of linear conductive elements 905 and 910 of FIG. 9 are arranged so that they extend linearly along the x-axis and are disposed at opposite ends of the non-conductive medium 305.

A fifth conductive element 915 is disposed at a first side of the third plurality of linear conductive elements 905 and a sixth conductive element 920 is disposed at a second side of the third plurality of linear conductive elements 905. The fifth and sixth conductive elements 915 and 920 are electrically interconnected with one another through the third plurality of linear conductive elements 905.

A seventh conductive element 925 is disposed at a first side of the fourth plurality of linear conductive elements 910 and an eighth conductive element 930 is disposed at a second side of the fourth plurality of linear conductive elements 910. The fifth and sixth conductive elements 925 and 930 are electrically interconnected with one another through the fourth plurality of linear conductive elements 910.

The conductive elements 915, 920, 925, and 930 are arranged to provide oppositely directed electromagnetic forces when an electrical current i" of sufficient magnitude is received. When sufficient electrical current i" is received, an electromagnetic force is generated by the third plurality of linear conductive elements 905 that has a direction opposite to the electromagnetic force generated by the fourth plurality of linear conductive elements 910. As a result, when the drive plate 130 is in the presence of electromagnetic field B during the application of electrical current i", the drive plate 130 is subject to a force that may rotate the drive plate 130 about an axis that is substantially perpendicular to a plane of the drive plate 130. With reference to FIG. 1, this arrangement may implement a tilt adjustment of the objective lens 105. This tilting adjustment compliments the focusing adjustment, provided by the first plurality of linear conductive elements 310, and the tracking adjustment, provided by the second plurality of linear conductive elements 405.

The third plurality of linear conductive elements 905 and the fourth plurality of linear conductive elements 910 may be arranged symmetrically with respect to the axis about which the drive plate 130 is rotatable. The fifth terminal 915 and eighth terminal 930 may be arranged on the drive plate 130 so that they are electrically connected with one another to conduct current to/from the outermost portions of the third plurality of linear conductive elements 905 and fourth plurality of linear conductive elements 910. The sixth terminal 920 and seventh terminal 925 may be arranged on the drive plate 130 so that they are electrically connected with one another to conduct current to/from the interiorly disposed portions of the third plurality of linear conductive elements 905 and fourth plurality of linear conductive elements 910.

In FIGS. 8 and 9, the first plurality of linear conductive elements 310 is arranged in a first plane at a first side of the non-conductive medium 305. The second, third, and fourth plurality of linear conductive elements 405, 905, and 910 are arranged in a second plane at a second side all of the non-conductive medium 305. However, the third and fourth plurality of linear conductive elements 905 and 910 may be disposed in the same plane as the first plurality of linear conductive elements 310. The third and fourth plurality of linear conductive elements 905 and 910 may alternatively be disposed in a layer of non-conductive medium 305 that is neither coplanar with the first plurality of linear conductive elements 310 or the second plurality of linear conductive elements 405.

With reference again to FIG. 7, the non-conductive medium 305 may be comprised of a single or multiple non-conductive layers. The various linear conductive elements 310, 405, 905, and 910 may be supported on the surfaces of the non-conductive medium 305 and/or by one or more surfaces of the multiple non-conductive layers.

Figure 10:
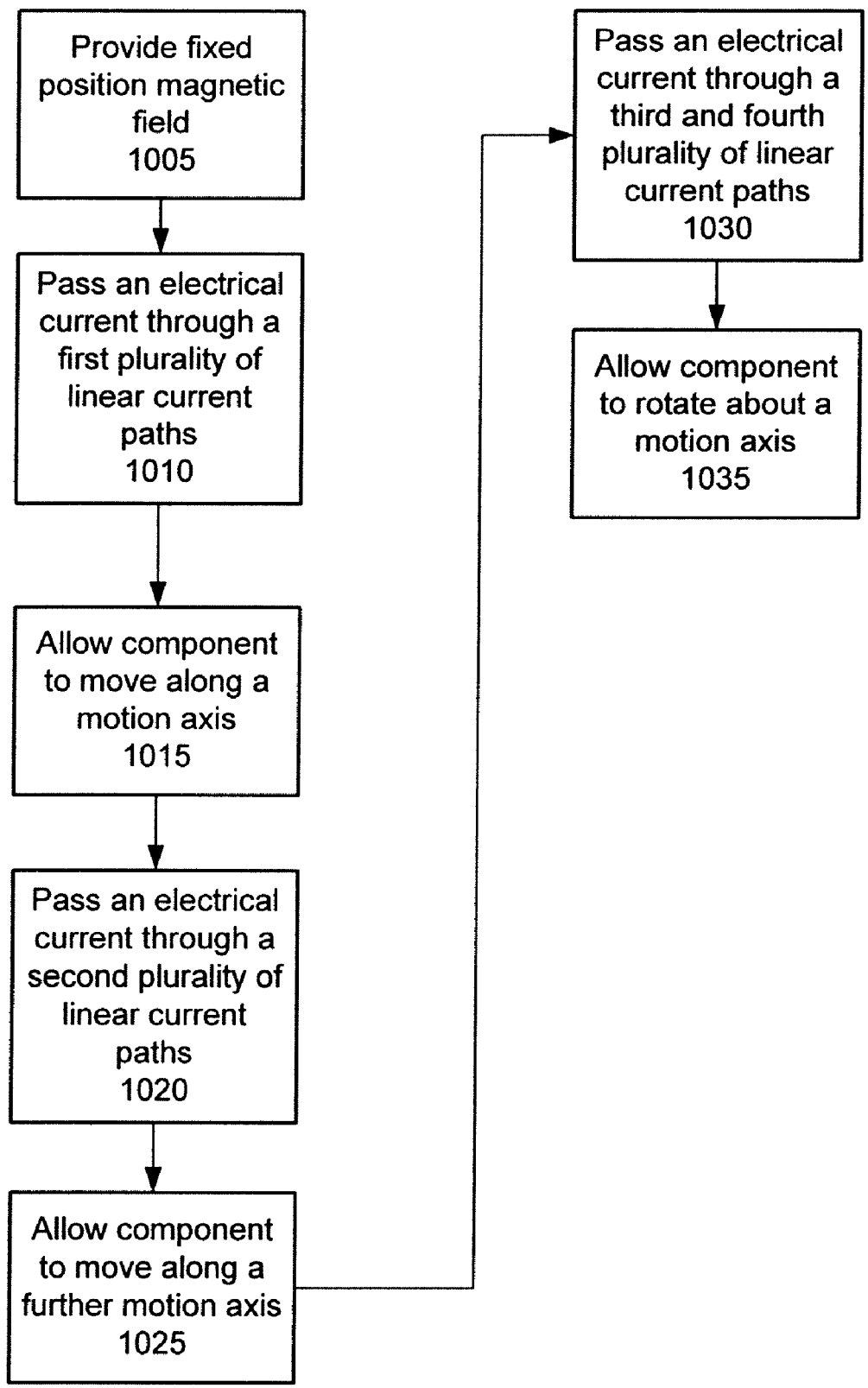
FIG. 10 shows operations for electromagnetically adjusting the position of a component, such as a reading and/or writing component of a storage device.

FIG. 10 shows operations for adjusting the position of a component, such as a reading and/or writing component of a storage device. At 1005, a fixed position magnetic field is provided. The component may be moved with respect to the fixed position magnetic field. At 1010, an electrical current is passed through a first plurality of linear current paths lying in the fixed position magnetic field. The first plurality of linear current paths may be arranged along a first axis. The component may be disposed in fixed alignment with the first plurality of linear current paths so as to be driven along a second axis that is perpendicular to the first axis of upon passage of the electrical current. This results in movement of the component along the second axis at 1015.

At 1020, an electrical current is passed along a second plurality of linear current paths lying in the fixed position magnetic field. The second plurality of linear current paths is arranged parallel to a third axis. The component is in fixed alignment with the second plurality of linear current paths so that it may be driven along a fourth axis that is perpendicular to the third axis at 1025.

Rotational motion may also be imparted to the component. At 1030, an electrical current is passed through a third plurality of linear current paths that are parallel to a fifth axis and through a fourth plurality of linear current paths that are parallel to a sixth axis. The component is in fixed alignment with the third and fourth plurality of linear current paths so that it may be rotated about a seventh axis at 1035 when the current is applied at 1030.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

We claim:
1. An electromagnetic drive comprising:
 a magnetic field;
 a drive plate including a non-conductive medium, the drive plate comprising:
  a first plurality of linear conductive elements arranged substantially parallel to a first axis, where each of the first plurality of linear conductive elements connects a first pair of electrical terminals supported by the non-conductive medium;
  a second plurality of linear conductive elements supported by the non-conductive medium and electrically connecting a second pair of electrical terminals; and
  a third plurality of linear conductive elements supported by the non-conductive medium and electrically connecting with at least one of the second pair of electrical terminals;
 where the drive plate is driven in the magnetic field along a second axis that is substantially perpendicular to the first axis when an electrical current of sufficient magnitude is passed through the first plurality of linear conductive elements;

further where the drive plate is rotated in the magnetic field about an axis that is substantially perpendicular to a plane of the non-conductive medium when an electrical current of sufficient magnitude is passed through the second and third plurality of linear conductive elements.

2. The electromagnetic drive of claim 1, further comprising first and second opposed permanent magnets disposed to generate the magnetic field.

3. An electromagnetic drive for use with a reading and/or writing component of a storage device comprising:
a base;
a magnetic field generator in fixed alignment with the base and disposed to generate a magnetic field;
a support movable with respect to the base and in fixed alignment with the reading and/or writing component of the storage device;
a drive plate disposed in the magnetic field and in fixed alignment with the support, the drive plate including a non-conductive medium, the drive plate comprising:
a first plurality of linear conductive elements arranged substantially parallel to a first axis, where the first plurality of linear conductive elements connect first and second electrical terminals supported by the non-conductive medium, where the drive plate and support are driven along a second axis that is substantially perpendicular to the first axis when an electrical current of sufficient magnitude is passed through the first plurality of linear conductive elements;
a second plurality of linear conductive elements supported by the non-conductive medium, where the second plurality of linear conductive elements are arranged substantially parallel to a third axis and connect third and fourth electrical terminals supported by the non-conductive medium, and where the drive plate and support are driven along a fourth axis that is substantially perpendicular to the third axis when an electrical current of sufficient magnitude is passed through the second plurality of linear conductive elements;
a third plurality of linear conductive elements supported by the non-conductive medium substantially parallel to a fifth axis and electrically connecting a fifth electrical terminal and a sixth electrical terminal; and
a fourth plurality of linear conductive elements supported by the non-conductive medium substantially parallel to a sixth axis and electrically connecting the fifth electrical terminal and the sixth electrical terminal;
where the drive plate and support are rotated about a seventh axis that is substantially perpendicular to a plane of the non-conductive medium when an electrical current of sufficient magnitude is passed between the fifth and sixth electrical terminals.

4. The electromagnetic drive of claim 3, where the third and fourth plurality of linear conductive elements are disposed at opposed ends of the non-conductive medium.

5. The electromagnetic drive of claim 3, where the third and fourth plurality of linear conductive elements are disposed at opposed ends of the non-conductive medium in respective regions exterior to the second plurality of linear conductive elements.

6. The electromagnetic drive of claim 3, where the magnetic field generator comprises first and second opposed permanent magnets disposed proximate opposite sides of the non-conductive medium.

7. The electromagnetic drive of claim 3, where the support comprises a lens holder and where the reading and/or writing component comprises an objective lens of an optical reader and/or storage device.

8. A reader and/or writer for a storage device comprising:
a base;
a magnetic field generator in fixed alignment with the base and disposed to generate a magnetic field;
a support movable with respect to the base, where the reading and/or writing component of the storage device is in fixed alignment with the support;
a drive plate disposed in the magnetic field and in fixed alignment with the support, the drive plate including a non-conductive medium supporting first, second, third, and fourth sets of linear conductive elements, where each of the first, second, third, and fourth sets of linear conductive elements connects a pair of electrical terminals supported by the non-conductive medium; and
where the drive plate and support are driven along a first axis when an electrical current of sufficient magnitude is passed through the first set of linear conductive elements, along a second axis when an electrical current of sufficient magnitude is passed through the second set of linear conductive elements, and rotated about an axis when an electrical current of sufficient magnitude is passed through the third and fourth sets of linear conductive elements.

9. The reader and/or writer of claim 8, where the first axis corresponds to a tracking axis of a reading and/or writing component of the storage device, where the second axis corresponds to a focus axis of the reading and/or writing component of the storage device, and where the third axis corresponds to a tilt axis of the reading and/or writing component of the storage device.

10. The reader and/or writer of claim 9, where the support comprises a lens holder and where the reading and/or writing component of the storage device comprises an objective lens.

* * * * *